United States Patent
Snoeijs (10) Patent No.: US 7,414,556 B2
(45) Date of Patent: Aug. 19, 2008

(54) ANALOG-TO-DIGITAL CONVERTER

(76) Inventor: Walter Snoeijs, Sous-Verzin, Cernex (FR) F-74350

(*) Notice: Subject to any disclaimer, the term of this patent is extended or adjusted under 35 U.S.C. 154(b) by 0 days.

(21) Appl. No.: 11/588,692

(22) Filed: Oct. 27, 2006

(65) Prior Publication Data
US 2007/0040723 A1    Feb. 22, 2007

Related U.S. Application Data

(63) Continuation of application No. PCT/EP2005/051850, filed on Apr. 26, 2005.

(30) Foreign Application Priority Data
Apr. 28, 2004  (EP) .................................. 04101803

(51) Int. Cl.
*H03M 1/12*  (2006.01)
(52) U.S. Cl. ........................... 341/122; 341/172
(58) Field of Classification Search ................. 341/122, 341/150, 161, 162, 163, 172
See application file for complete search history.

(56) References Cited

U.S. PATENT DOCUMENTS

| | | | |
|---|---|---|---|
| 5,544,102 A * | 8/1996 | Tobita et al. ............ | 365/189.09 |
| 6,124,818 A | 9/2000 | Thomas et al. | |
| 6,275,178 B1 * | 8/2001 | Koifman et al. ............ | 341/143 |
| 6,433,712 B1 | 8/2002 | Ohnhaeuser et al. | |
| 6,909,391 B2 * | 6/2005 | Rossi ........................ | 341/161 |
| 2005/0068218 A1 * | 3/2005 | Kobayashi et al. .......... | 341/161 |
| 2005/0083120 A1 * | 4/2005 | Roos et al. .................... | 330/86 |

FOREIGN PATENT DOCUMENTS

EP    0 159 709    10/1985

* cited by examiner

*Primary Examiner*—Howard Williams
(74) *Attorney, Agent, or Firm*—Pearne & Gordon LLP (57) ABSTRACT

The invention relates to signal processing circuits, analog-to-digital conversion circuits (A/D conversion circuit) and track and hold and sample and hold circuits. A circuit transfers charge from a first capacitor to a second one 5 where the transfer is enhanced by means of a control signal which influences the value of at least one capacitor. This circuit can be used as an amplifier or a sample and hold circuit, and does not consume any standing current. This circuit can be advantageously combined with a novel capacitor arrangement which allows the generation of multiple residues and reference levels, and the carrying out of multiple operations in parallel. This can improve the overall performance of analog-to-digital converters, including multi-step converters as pipeline and successive approximation converters. The present invention provides amplification and sampling of signals without standing current, and generation of many reference levels and multiple residues in parallel. The present invention allows to eliminate the integrators in traditional analog-to-digital converters and therefore offers reduces power and enhances performance of analog-to-digital converters.

26 Claims, 7 Drawing Sheets

ANALOG-TO-DIGITAL CONVERTER

REFERENCE DATA

This application is a continuation of International Patent Application PCT/EP2005/051850 (WO2005/107079) filed on Apr. 26, 2005, claiming priority of European patent application EP04101803 of Apr. 28, 2004, the contents whereof are hereby incorporated.

FIELD OF THE INVENTION

The invention relates to signal processing circuits, amplifiers, analog-to-digital conversion circuits (A/D conversion circuit) and track and hold and sample and hold circuits.

DESCRIPTION OF RELATED ART

The performance improvement of digital electronics over the past 30 to 40 years has caused electronic systems to be implemented in a primarily digital way. This has significantly raised the interest in analog-to-digital converters which need to translate data from the analog to the digital domain for these digital systems. Often these converter circuits are the bottleneck in terms of speed, resolution and power for the full system, and they have therefore been the object of intensive research.

The fastest converter still remains the flash converter which for an N bit conversion of an input signal IN comprises $2^N-1$ comparators CO1 ... $CO2^N-1$. Each of these comparators CO1 ... $CO2^N-1$ is associated with a certain input signal level and determines whether the input signal is above or below this level. Often these reference levels are generated by a string of resistors R1 ... $R2^N-1$ normally of substantially equal resistance value, in between voltages VX and VY. This results in a series of $2^N-1$ reference voltages between VX and VY, which corresponds for this example to the input range.

Flash converters have two disadvantages for large values of N: the number of comparators explodes resulting in large area and power consumption, and the decrease of the distance between neighboring levels puts severe requirements on the comparators which need to be able to react on smaller signals with an increased precision. To reduce the error on the comparator level, or the comparator offset, the size of the components in the comparator has to be increased, and this leads to larger parasitic capacitances. Therefore this increases the power and area consumption even more for large values of N.

Therefore several other converter architectures have been developed which reduce the number of comparators. Several of these architectures carry out the conversion in multiple phases with increasing accuracy. Each conversion phase consists of the coarse conversion and the determination of the residue. This residue is the difference between an analog representation—provided by a digital-to-analog converter—of the result of the coarse conversion and the original signal on which the coarse conversion was carried out. The first coarse conversion is carried out on the input signal while the other coarse conversions are carried out on the residue obtained during the previous coarse conversion. Several families within this type of converter exist: the successive approximation converter uses the same components during subsequent phases, the pipelined converter makes use of a pipeline where the residues are transferred to the next stage in the pipeline.

Usually these converters need accurate amplifiers to generate and amplify the residue, which often are implemented as integrators, which contain one or more capacitors in the feedback loop. The precision is obtained by means of extremely high open loop gains. These integrators or accurate amplifiers are usually dominant in the power consumption of these converters.

In addition, closed loop operation requires care to guarantee stability, and typically results in operating bandwidths well below the fundamental limits of the technology.

It is therefore a first aim of the invention to provide a means to generate the residue which allows the use of simple open loop amplifiers for its amplification. It is a second aim of the invention to provide an open loop amplification scheme which is particularly suited for this application.

Often the input signal of a converter is sampled onto sample capacitors which store the input signal in the form of electrical charge. This charge is often read by means of an integrator, which as described above is a power consuming circuit. It is therefore a third aim of the present invention to provide a means to sample and read the signal charge without the use of an integrator.

BRIEF SUMMARY OF THE INVENTION

According to the invention, these aims are achieved by a circuit having the characteristics of the independent claims, advantageous embodiments being furthermore given by the dependent claims.

The first aim, to provide a means to generate the residue, is achieved in particular by a circuit using a special capacitor arrangement where the residue is generated simultaneously on several circuit nodes. The circuit allows the introduction of well-determined offsets between said circuit nodes. These offsets can be used as reference for subsequent conversion phases if open loop amplifiers are used to amplify the residue. As will be seen further, this circuit using a special capacitor arrangement is quite flexible and can be adapted to many analog-to-digital converter architectures.

The second aim, to provide an open loop amplification means which is particularly suited for residue amplification, is achieved by a charge transfer circuit which, in contrast to charge coupled devices (CCD's), can be implemented in standard CMOS without modifications in technology. As will be seen further, this open loop circuit consumes no static power consumption and is capable of providing very large gains. In addition this amplification means is particularly suited to allow the sampling of charge and therefore provides the means to achieve the third aim of the invention, to avoid the use of an integrator in the sample and hold circuit.

BRIEF DESCRIPTION OF THE DRAWINGS

The invention and its additional features, which may optionally be used to implement the invention to best advantage, will be apparent from and elucidated with reference to the embodiments described hereafter with reference to the accompanying drawings, wherein:

FIG. 5b shows the control signals for the embodiment shown in FIG. 5a;

FIG. 6b shows a more schematic representation of the embodiment of FIG. 6a;

FIG. 8b shows the control signals of the embodiment in FIG. 6a;

FIG. 9b shows a schematic representation of the embodiment of FIG. 9a;

FIG. 10b shows a more schematic representation of the embodiment of FIG. 10a.

DETAILED DESCRIPTION OF THE INVENTION

Figure 1:
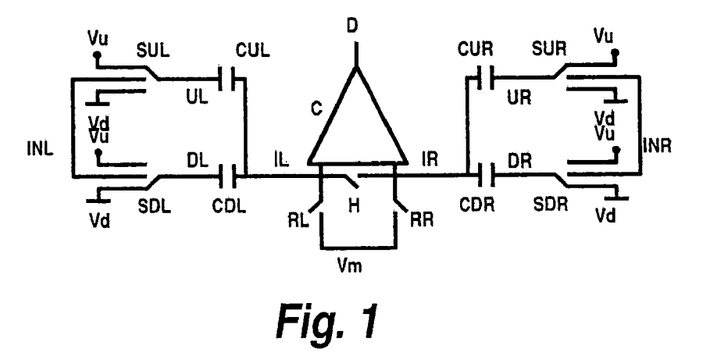
FIG. 1 shows a prior art sampling and comparison circuit used as a starting point to explain the circuit according to the invention.

FIG. 1 shows a prior art building block of a converter, which allows sampling of the input signal, the comparison of this input signal to a reference level, and to add a well-defined signal to this input signal. The operation of this circuit is particularly instructive for the operation of a preferred embodiment according to the invention and will therefore be explained in some detail. The circuit shown in FIG. 1 is a differential circuit receiving two input signals INL and INR of which the difference needs to be converted. The circuit comprises a comparator C with first and second inputs IL and IR and digital output D, which reflects which of the two comparator inputs IL or IR is higher in potential than the other. Note that the comparator C can comprise a preamplifier circuit to allow the comparison decision to be made on signals of large amplitude. The first comparator input IL corresponds to the first input signal INL and the second comparator input IR corresponds to the second input signal INR. The first and second comparator inputs IL and IR can be shorted together by means of a switch H. The first comparator input IL can be connected to a first reference potential Vm by means of a switch RL. Similarly the second comparator input IR can be connected to the first reference potential Vm by means of a switch RR. The first comparator input IL is further connected to the first terminal of a first and a second capacitor CUL and CUR, respectively. The second terminal UL of the first capacitor CUL can be connected to a second reference potential Vu, the third reference potential Vd, or the first input signal INL by means of the switch SUL. Similarly, the second terminal DL of the second capacitor CDL can be connected to the second reference potential Vu, the third reference potential Vd, or the first input signal INL by means of the switch SDL. Similarly the second comparator input IR is further connected to the first terminal of a third and a fourth capacitor CUR and CDR, respectively. The second terminal UR of the third capacitor CUR can be connected to the second reference voltage Vu, the third reference potential Vd, or the second input signal INR by means of the switch SUR. The second terminal UL of the fourth capacitor CUR can be connected to the second reference voltage Vu, the third reference potential Vd, or the second input signal INR by means of the switch SDR. Note that in practice the switches SUL, SDL, SUR, SDR will consist of several switches to implement the switching function previously described. It is also common practice to choose the third reference voltage Vd equal to the circuit ground as that avoids the generation of one reference voltage.

The operation of the circuit shown in FIG. 1 will now be further described.

In a first phase, the input signals INL and INR are being tracked. The nodes UL and DL are connected to the first input signal INL by means of the switches SUL and SDL. The nodes UR and DR are connected to the second input signal INR by means of the switches SUR and SDR. The switches RL and RR are closed to connect the first and second comparator inputs IL and IR to the first reference voltage Vm, respectively. The switch H can be closed to reduce the resistance between the two comparator outputs IL and IR. The hold command is given by opening the switches RL, RR and H thus disconnecting the comparator inputs IL and IR from each other and from the first reference voltage Vm. Subsequently, the second terminals UL, DL, UR and DR of capacitors CUL, CDL, CUR and CDR are disconnected from the input signals INL and INR, UL and UR are connected to the second reference voltage Vu and DL and DR to the third reference voltage Vd, all this by means of the switches SUL, SDL, SUR and SDR. If the capacitance values of the first and fourth capacitor CUL and CDR equal x times Cval, where x is a value between 0 and 1, and the capacitance values of the second and third capacitor CDL and CUR equal (1−x) times Cval, the sum of the capacitance values of the first and second capacitors C1L and C2L is equal to the sum of the capacitance values of the third and fourth capacitors C1R and C2R, and equal to Cval. Neglecting parasitic charge injection, moving the second terminals of the first and second capacitors C1L and C2L from the input signal INL to the second and third reference voltage Vu and Vd respectively, injects a charge QL into the first comparator input IL equal to:

$$QL = Cval(Vu-INL)x + Cval(Vd-INL)(1-x)$$

Similarly a charge QR is injected into the second comparator input IR equal to:

$$QR = Cval(Vu-INR)(1-x) + Cval(Vd-INR)x$$

The difference Qdif between the charge QL injected into the first comparator input IL and the charge QR injected into the second comparator input IR is a measure of the differential input signal applied to the comparator C. This difference Qdif equals:

$$Qdif = QL - QR = Cval(INR-INL) + Cval(Vu-Vd)(1-2x)$$

Note that when the hold command is given, the first and second comparator inputs IL and IR are isolated in dc (only capacitive coupling to the exterior, neglecting leakage). This means that no net charge can be transferred to these nodes any more. Therefore the difference Qdif will be accommodated by some voltage shift on these nodes in order to balance Qdif.

Note also that if Qdif is positive, the first comparator input IL of the circuit will be at a higher potential than the second comparator input. However, the circuit in FIG. 1 behaves such that that means that the difference between the second input signal INR and the first input signal INL is larger than the reference level (Vu−Vd)(2x−1), so a first input signal INL at a larger potential will yield a lower potential of the first comparator input IL after the hold command is given and the capacitors CUL, CDL, CUR and CDR have been disconnected from the input signals and connected instead to either the second or third reference potentials Vu or Vd.

The digital output D of the comparator C will be an approximative representation of the sign of Qdif with an error determined by comparator offset and other differential parasitics. Further examining the expression for this difference Qdif yields that the sign of this difference Qdif corresponds to whether the differential input IND, which is the difference between the second and first input signals INR and INL, is above or below a voltage level equal to (2x−1)(Vu−Vd). So, by varying the parameter x the reference level for the comparison can be varied from the difference between the second and third reference voltages Vu and Vd to minus this difference. For instance for equal capacitance values for the first through the fourth capacitors C2L, C2L, C1R and C2R, x equals 0.5, and the reference level will equal zero, so in that case the comparator output D will ideally reflect whether the difference between the first and second input signal INL and INR is positive or negative. So, if x is varied uniformly between 0 and 1 for a series of circuits as shown in FIG. 1, a flash converter can be constructed.

After evaluation of the comparison the circuit in FIG. 1 can also perform a digital-to-analog conversion function, useful for a multistep converter. Here we assume that the second reference potential Vu is higher than the third reference potential Vd. If the comparison yielded that the difference signal Qdif was positive, the second terminals UL and DL of both the first and second capacitor CUL and CDL are linked to the third reference voltage Vd by means of the switches SUL and SDL. The second terminals UR and DR of both the third and fourth capacitor CUR and CUR are linked to the second reference voltage Vu by means of the switches SUR and SDR. If Qdif was evaluated to be negative, UL and DL are linked to the second reference voltage Vu, and UR and DR are linked to the third reference voltage Vd, by means of the switches SUL, SDL, SUR and SDR, respectively.

Also for this case the difference Qdif2 between the charge QL2 injected into the first comparator input IL and the charge QR2 injected into the second comparator input IR can be calculated (Note that the charge injected is calculated with respect to the situation at the instant the hold command was given):

If Qdif was evaluated positive:

$Qdif2=QL2-QR2=Cval(Vd-INL)-Cval(Vu-INR)$

Or $Qdif2=Cval(INR-INL)-Cval(Vu-Vd)$

And if Qdif was evaluated negative:

$Qdif2=Cval(INR-INL)+Cval(Vu-Vd)$

Note that the circuit shown in FIG. 1 is differential. To obtain a single-ended rather than a differential circuit, it is possible to connect one of the comparator inputs, for instance the second comparator input IR, to the first reference potential Vm and to use only the switches related to the first input signal INL and to the first comparator input IL in a similar way as previously described.

Figure 2:
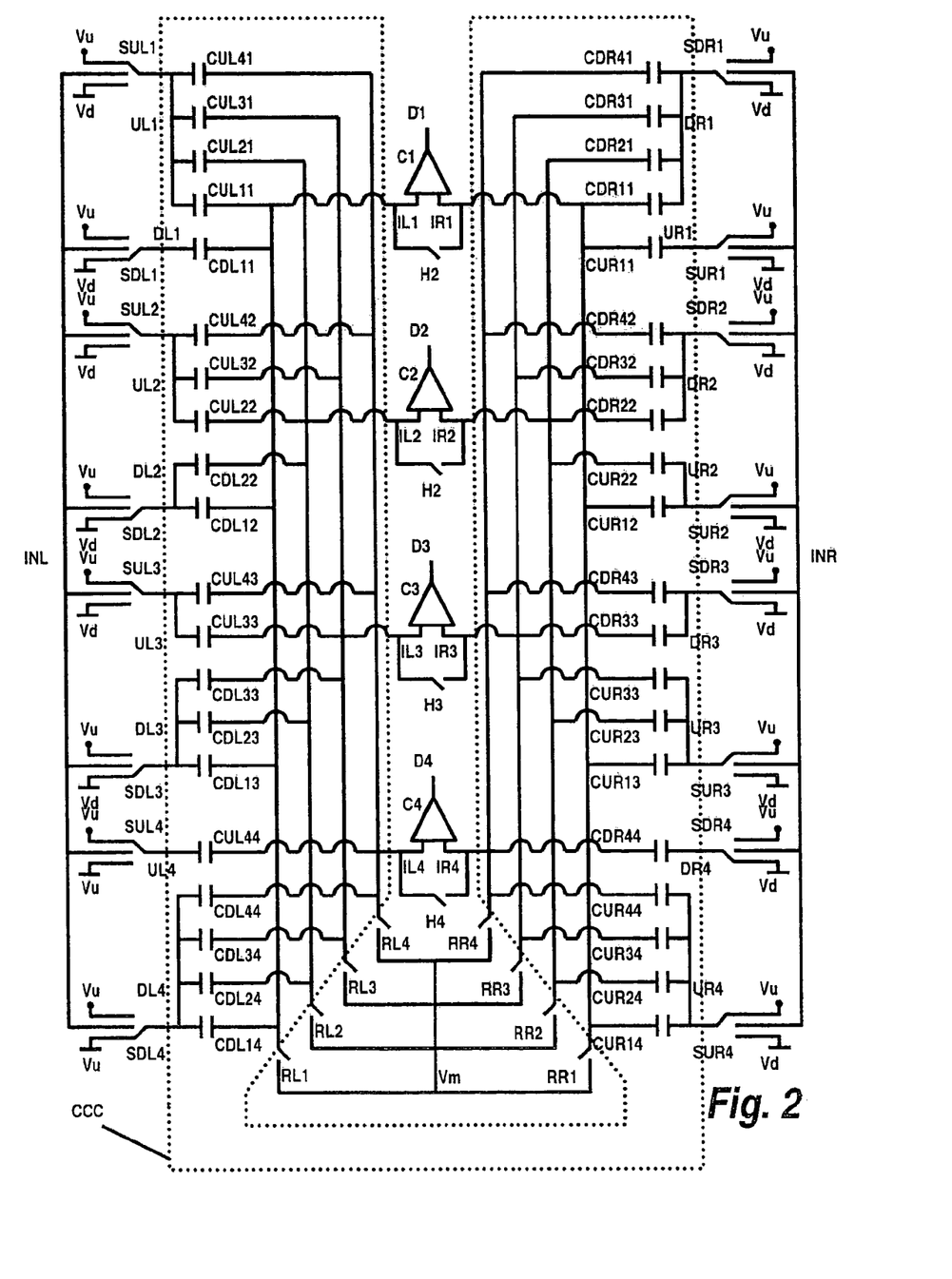
FIG. 2 illustrates a preferred embodiment of an analog-to-digital converter with a special capacitor arrangement according to the invention.

FIG. 2 shows a preferred embodiment of a circuit with the special capacitor arrangement according to the present invention. The figure shows the circuit for 4 comparison circuits, the extension to a different number of circuits should be obvious to a person skilled in the art. The circuit of FIG. 2 is very similar to the circuit of FIG. 1 repeated four times. It consists of four comparators C1 . . . C4, with digital outputs D1 . . . D4, and first and second comparator inputs IL1 . . . IL4 and IR1 . . . IR4. Switches RL1, RR1 and H1 allow to connect the first and second comparator inputs IL1 and IR1 of the first comparator C1 to the first reference voltage Vm. Similarly, switches RL2 . . . RL4, RR2 . . . RR4, H2 . . . H4 provide the same function for the first and second inputs IL2 . . . IL4 and IR2 . . . IR4 of the other comparators C2 . . . C4. Similar to a four-times repetition of the circuit of FIG. 1, the input signal INR−INL is sampled, and a comparison is carried out between the sampled input signal INR−INL and four different levels determined by capacitor ratios. The difference with a simple four-times repetition of the circuit in FIG. 1 lies in the capacitor array CCC and in how the comparison result affects the switching of the capacitor array. A four-times repetition of the circuit in FIG. 1 would allow the sampling of the input signal and its comparison to four different levels if the ratio x is varied for the for different circuits. For a four-times repetition of the circuit of FIG. 1, the output of each comparator will affect the setting of the capacitors at its own inputs only. The purpose of the capacitor arrangement according to the invention is that the each of the comparator outputs D1 . . . D4 will affect the switching of capacitors linked to inputs of more than one comparator. For this example, after comparison, the output of each of the comparators affects the switching of a capacitor at an input of every comparator in the circuit. In the circuit of FIG. 2, switches SUL1, SDL1, SUR1 and SDR1 are controlled by the comparator output D1 of the first comparator C1. Similarly SUL2, SDL2, SUR2 and SDR2 are controlled by the comparator output D2 of the second comparator C2, etc . . . SUL1 allows to connect the node UL1 to the first input INL, the second reference voltage Vu, or the third reference voltage Vd. SDL1 allows to connect the node DL1 to the first input INL, the second reference voltage Vu, or the third reference voltage Vd, etc . . . During tracking the nodes UL1 . . . UL4 and DL1 . . . DL4 are connected to the first input signal, and the nodes UR1 . . . UR4 and DR1 . . . DR4 are connected to the second input signal. For the comparison UL1 . . . UL4 and UR1 . . . UR4 are connected to the second reference voltage Vu, and DL1 . . . DL4 and DR1 . . . DR4 are connected to the third reference voltage Vd. After comparison the comparator output D1 of the first comparator affects the switching of SUL1, SDL1, SUR1 and SDR1 and therefore affects the potential of the nodes UL1, DL1, UR1 and DR1. If D1 is positive UL1 and DL1 will be connected to the third reference voltage Vd, and UR1 and DR1 to the second reference voltage. The opposite will be done if D1 is positive after the comparison. The other comparator outputs will control the nodes UL2 . . . UL4, DL2 . . . DL4, UR2 . . . UR4, DR2 . . . DR4 in a similar way. The table below gives an overview of how the capacitor array is connected, and the value of the capacitors relative to a unit capacitor Cval to obtain a comparison reference level of −¾(Vu−Vd), −¼(Vu−Vd), ¼(Vu−Vd), and ¾(Vu−Vd) for the comparators C1 . . . C4, respectively. The value chosen for the capacitors will create the same DAC value for all for of the four comparator circuits after comparison, and the DAC values are −(Vu−Vd), −½(Vu−Vd), 0, ½(Vu−Vd),(Vu−Vd): for instance if the comparator outputs D1 and D2 are positive and D3 and D4 are negative, the DAC value will be set to zero. In other words, the circuit generates the residue at the inputs of each of the four comparators.

| | | | | | | | |
|---|---|---|---|---|---|---|---|
| CDL11 | DL1 | IL1 | ⅛ | CUR11 | UR1 | IR1 | ⅛ |
| CUL11 | UL1 | IL1 | ⅛ | CDR11 | DR1 | IR1 | ⅛ |
| CUL21 | UL1 | IL2 | ¼ | CDR21 | DR1 | IR2 | ¼ |
| CUL31 | UL1 | IL3 | ¼ | CDR31 | DR1 | IR3 | ¼ |
| CUL41 | UL1 | IL4 | ¼ | CDR41 | DR1 | IR3 | ¼ |
| CDL12 | DL2 | IL1 | ¼ | CUR12 | UR2 | IR1 | ¼ |
| CDL22 | UL2 | IL2 | ⅛ | CDR22 | DR2 | IR2 | ⅛ |
| CUL22 | UL2 | IL2 | ⅛ | CDR22 | DR2 | IR2 | ⅛ |
| CUL32 | UL2 | IL3 | ¼ | CDR32 | DR2 | IR3 | ¼ |
| CUL42 | UL2 | IL4 | ¼ | CDR42 | DR2 | IR3 | ¼ |
| CDL13 | DL3 | IL1 | ¼ | CUR13 | UR3 | IR1 | ¼ |
| CDL23 | DL3 | IL2 | ¼ | CUR23 | UR3 | IR2 | ¼ |
| CDL33 | DL3 | IL3 | ⅛ | CUR33 | UR3 | IR3 | ⅛ |
| CUL33 | UL3 | IL3 | ⅛ | CDR33 | DR3 | IR3 | ⅛ |
| CUL43 | UL3 | IL4 | ¼ | CDR43 | DR3 | IR4 | ¼ |
| CDL14 | DL4 | IL1 | ¼ | CUR14 | UR4 | IR1 | ¼ |
| CDL24 | DL4 | IL2 | ¼ | CUR24 | UR4 | IR2 | ¼ |
| CDL34 | DL4 | IL2 | ¼ | CUR34 | UR4 | IR3 | ¼ |
| CDL44 | DL4 | IL4 | ⅛ | CUR44 | UR4 | IR4 | ⅛ |
| CUL44 | UL4 | IL4 | ⅛ | CDR44 | DR4 | IR4 | ⅛ |

This illustrates that this circuit can generate the residue R many times in a simple way and this due to the capacitor arrangement CCC. This capacitor arrangement CCC is novel, because the outputs of the comparators affect the inputs of the different comparators by means of different capacitors. This is novel and is therefore an object of the invention. In this example the inputs of every comparator are affected by every comparator output by means of a separate capacitor. In general, the novelty of the capacitor arrangement is characterized by the fact that at least one comparator output affects the inputs of at least two comparators through a separate set of capacitors.

In practice some well-determined offset can be subtracted from the residue R at each of the comparator inputs. This offset could be different for each of the comparator inputs, to allow immediate comparison of the residue and the newly subtracted offset. This would allow to immediately compare the residue again to this offset or could be used as reference after open-loop amplification. This can be done by adding two capacitors to each comparator input, of which the sum of the capacitance values is constant but their ratio xd varies for the different comparators, as for the capacitors CUL, CDL, CUR and CDR in FIG. 1, for instance connecting the first terminal of capacitors DUL1 and DDL1 to the first comparator input IL1 of the first comparator C1, and the first terminal of capacitors DUR1 and DDR1 to the second comparator input IR1 of the first comparator C1. During tracking and comparison the second terminal of DUL1 and DUR1 is connected to the second reference voltage Vu, and the second terminal of DDL1 and DDR1 to the third reference voltage Vd. After comparison, the second terminal Of DUL1 and DUR1 is connected to the third reference voltage Vd and the second terminal of DDL1 and DDR1 is connected to the second reference voltage Vu. This will create an offset at the input of the first comparator D1 determined by the ratio xd between the capacitance values of DUL1 and DDL1 which in this example is the same as the ratio between DDR1 and DUR1.

Another possibility would be to add an array of capacitors similar to the one shown in FIG. 2 which would not be switched during the first conversion and which would be switched after the first conversion to create an offset, similar to the previous example, but which in this case is added or subtracted from the residue for a subsequent comparison. This way a multibit successive approximation converter can be implemented.

At a certain point the comparator offset might become too large making it desirable to combine or average the residues at the different comparator inputs to a smaller number, which would then be more precise due to averaging. This could be done by connecting all first inputs IL1 . . . IL4 to the first input of a differential integrator and all second inputs IR1 . . . IR4 to the second inputs of a differential integrator. This integrator would measure and amplify the charge left on the comparator inputs, which is the residue. However, as explained in the introduction this would be a power consuming solution. One could use open-loop amplifiers, for instance differential pairs Diff1 . . . Diff4, IL1 being connected to the first input of the first differential pair Diff1, IL2 to the first input of the second differential pair Diff2, etc . . . , and IR1 . . . IR4 connected to the second input of the differential pairs Diff1 . . . Diff2, respectively. These differential pairs would output differential currents Id1 . . . Id4, which can easily be combined by linking the corresponding outputs together. However, an open-loop amplifier does not have a well defined gain, and therefore some reference needs to be provided. If we apply a well-determined offset−Delta at the inputs of comparators D1 and D2 and a well-determined offset+Delta at the inputs of comparators D3 and D4, we can use this as a reference for further conversion steps, if we combine the differential currents Id1 and Id2, and the differential currents Id3 and Id4.

In a more realistic example one would often have many more comparators. In a preferred embodiment the outputs (the differential currents) of the comparators would be combined in two groups, where there is a well determined offset between the resulting global differential current outputs. If these current signals are converted to voltage (for instance by injecting them into a resistor) and buffered, we obtain four signals (the current signals were differential, so had a positive and a negative current output), respectively proportional to Delta/2+R/2,−Delta /2+R/2,Delta/2−R/2, and −Delta/2−R/2. If Delta is chosen sufficiently large to guarantee it be larger than R, one can use a second circuit similar to the one in FIG. 2 where the switches SUL1, SDL1, SUR1 and SDR1, etc . . . now only connect to the electrodes corresponding to the second and third reference voltages Vu and Vd. However, on the side of the switches SUL1 and SDL1, the second reference voltage Vu is replaced by the signal proportional to Delta/2+R/2, and the third reference voltage Vd is replaced by the signal proportional to −Delta/2+R/2. On the side of the switches SUR1 and SDR1, the second reference voltage Vu is replaced by Delta/2−R/1 and the third reference voltage Vd by −Delta/2−R/2. If the comparators in this second circuit are reset when UL1 . . . UL4 in this second circuit are connected to the signal proportional to Delta/2+R/2 and DL1 . . . DL4 in this second circuit to the signal proportional to −Delta/2+R/2, UR1 . . . UR4 in this second circuit to the signal proportional to Delta/2−R/2 and DR1 . . . DR4 in this second circuit to the signal proportional to −Delta/2−R/2, and after reset switched from the Vu terminal to the Vd terminal and vice versa, one obtains signals on the comparators which compare the residue to a well determined reference level in the interval −Delta . . . Delta determined by the capacitor ratios. This illustrates how making use of this novel capacitor array two times in the same circuit can be used advantageously to carry both signal and reference information and proceed with further conversions. Afterwards one can again switch back or not determined by the comparison result, and generate a new residue at the inputs of the comparators in this circuit similar to the circuit of FIG. 2.

Differential pairs were just one possible example of an open loop circuit. Many more possibilities exist.

A further aim of the invention is to provide a means of amplification particularly suited for this purpose. As will become clear below this new way of amplification also allows signal storage, and therefore allows, once the signal stored, to take away the input. This liberates the first converter stage for a new conversion and allows the construction of a pipelined converter. In addition this circuit is also capable of sampling the input signal without the use of an integrator.

Figure 3A:
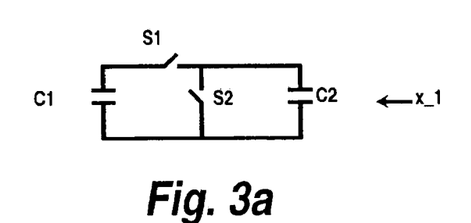
FIG. 3*a* illustrates a way to transfer charge from one capacitor to another according to the invention.
Figure 3B:
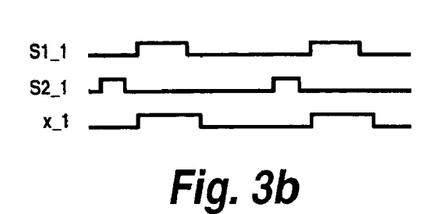
FIG. 3*b* shows the control signals for the circuit shown in FIG. 3*a*.

The invention is based on capacitive charge redistribution, illustrated in FIG. 3a. The first terminal of a first capacitor C1 in FIG. 3 can be connected to the first terminal of a second capacitor by means of a first switch S1, while the second terminal of the two capacitors are always connected. A second switch S2 can connect the first to the second terminal of the second capacitor C2 and reset C2. It is assumed here for simplicity that charge injection due to the switches can be neglected. The first switch S1 is in the open position, and the second switch S2 is in the open position after a reset of the second capacitor C2. The first capacitor C1 carries a charge q. If the switch S1 is closed to connect the first terminals of the first and second capacitors C1 and C2 some fraction of the charge q will be transferred from the first capacitor C1 to the second capacitor C2. The remaining charge q1 on the first capacitor C1 and the resulting charge q2 on the second capacitor equal:

$q1=q/(1+C2/C1)$ and $q2=q/(1+C1/C2)$

So, the larger the second capacitor C2 the more charge it will receive. If the capacitance value of the second capacitor can be influenced by means of a control signal x_1 which severely increases the capacitance value of the second capacitor C2, most of the charge q is transferred to the second capacitor C2. If then after opening the switch S1 the value of the second capacitor is severely reduced, the charge q2 transferred to the second capacitor cannot escape from the second capacitor and will cause a large voltage to be developed across the second capacitor, which can be significantly larger than the voltage induced by the original charge q on the first capacitor C1. So, amplification and storage can be realized by exploiting the non-linearity of a circuit in which a capacitance value varies controlled by a control signal.

Note that the kTC noise normally present when switching capacitors can be severely reduced when resetting the capacitor C2 by performing the reset while controlling the value of the capacitance C2 to its low value.

Figure 4:
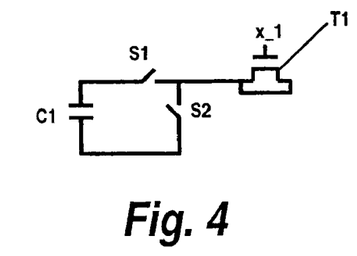
FIG. 4 shows a preferred embodiment according to the present invention.

FIG. 4 shows an embodiment where the second capacitor C2 has been replaced by MOS transistor, in this case an NMOS transistor T1. In the embodiment shown source and drain of T1 are connected to each other and to the switches S1 and S2. Source and drain will receive the charge. When the transistor is in the off state, the capacitance of the source-drain electrode is very small, in the on-state this electrode is connected to the channel which sees the gate capacitance and the full well or substrate capacitance. So, a transistor is ideally suited as a variable capacitor. In this embodiment source and drain both exist and are connected together. It should be clear that a gate next to a diffusion (so only one of the two) would function equally well.

In another non illustrated embodiment, a PMOS transitor could be used instead of the NMOS transistor T1.

Figure 5A:
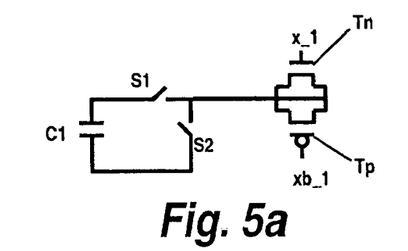
FIG. 5a shows another preferred embodiment according to the present invention.
Figure 5B:
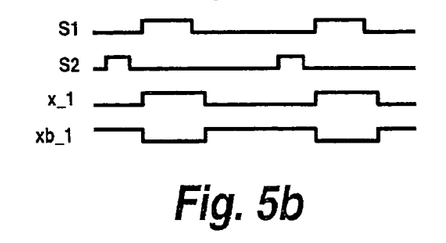

Another embodiment is shown in FIG. 5a. The non-linear capacitor element comprises two transistors, an NMOS transistor Tn and a PMOS transistor Tp, of which the sources and drains which are all connected together form the node to which the charge is transferred. FIG. 5b shows the control signals for the embodiment in FIG. 5a: during reset and amplification the transistors are driven in the off-state, during charge transfer they are switched on, which requires to drive the gate of the PMOS transistor with a signal of opposite polarity than the signal driving the gate of the NMOS transistor.

A very significant advantage provided by the invention—as illustrated by the embodiments already discussed—is that no standing current is needed to provide amplification.

This method of amplifying the voltage developed by a charge signal on a capacitor can be quite generally applied: for instance in sensor applications, in pipelines for charge transfer, in analog-to-digital converters, in sample and hold circuits.

Figure 6A:
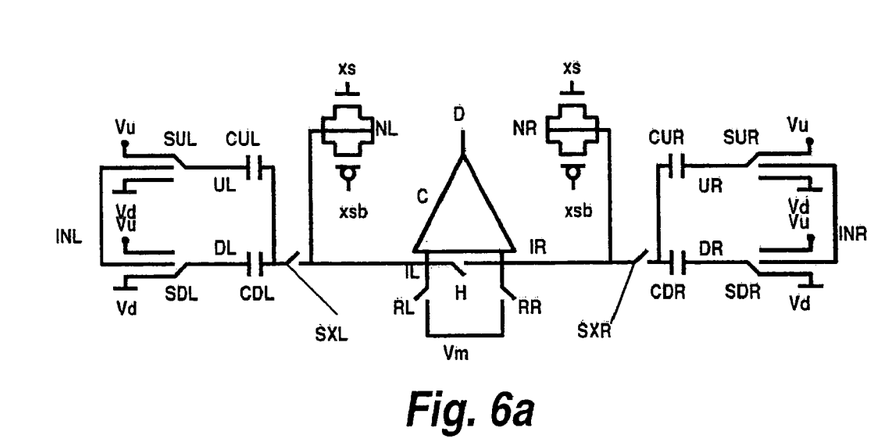
FIG. 6a shows an embodiment according to the invention of a building block for an analog-to-digital converter.

This method of amplification can be advantageously used in analog-to-digital converters. An embodiment of a building block similar to the circuit shown in FIG. 1 is shown in FIG. 6a. A switch SXL is inserted between the first comparator input IL and the capacitors CDL and CUL and a switch SXR is inserted between the second comparator input IR and the capacitors CDR and CUR. Non-linear controllable capacitor elements NL and NR are connected to the first and second comparator inputs IL and IR, respectively. The operation of the circuit is similar to the operation of the circuit shown in FIG. 1. During tracking the comparator inputs IL and IR are connected to each other and to a reference voltage Vm. Switches SXL and SXR are closed. The non-linear capacitors NL and NR are controlled to a low capacitance value. After the hold command is given and the inputs INL and INR are disconnected from the circuit using the switches SUL, SUR, SDL and SDR, the capacitors are connected to the second and third reference voltage instead to define the comparator level, and the non-linear capacitors NL and NR are driven to high capacitance value. This transfers most of the charge on the capacitors CUL, CUR, CDL and CDR to the comparator inputs IL and IR, after which the switches SXL and SXR are opened. The non-linear capacitances NL and NR are driven to low capacitance value realizing amplification prior to comparison by the comparator C. For the digital-to-analog conversion function of the circuit, the switches SXL and SXR are closed again, and the capacitors are connected to the second and third reference voltage Vu and Vd in the same way as for the circuit in FIG. 1. This embodiment illustrates again how the invention can be advantageously used to provide amplification without standing current.

Figure 6B:
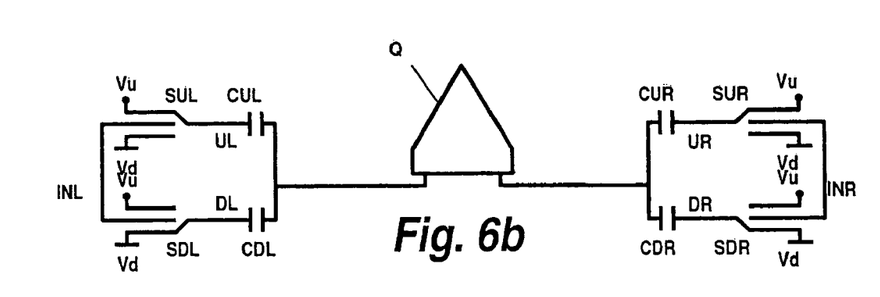

FIG. 6b shows a more schematic representation of the embodiment shown in FIG. 6a: comparator C, switches SXL and SXR, and switches H, RL, and RR, and non-linear capacitors NL and NR are all incorporated in one block Q.

Figure 7:
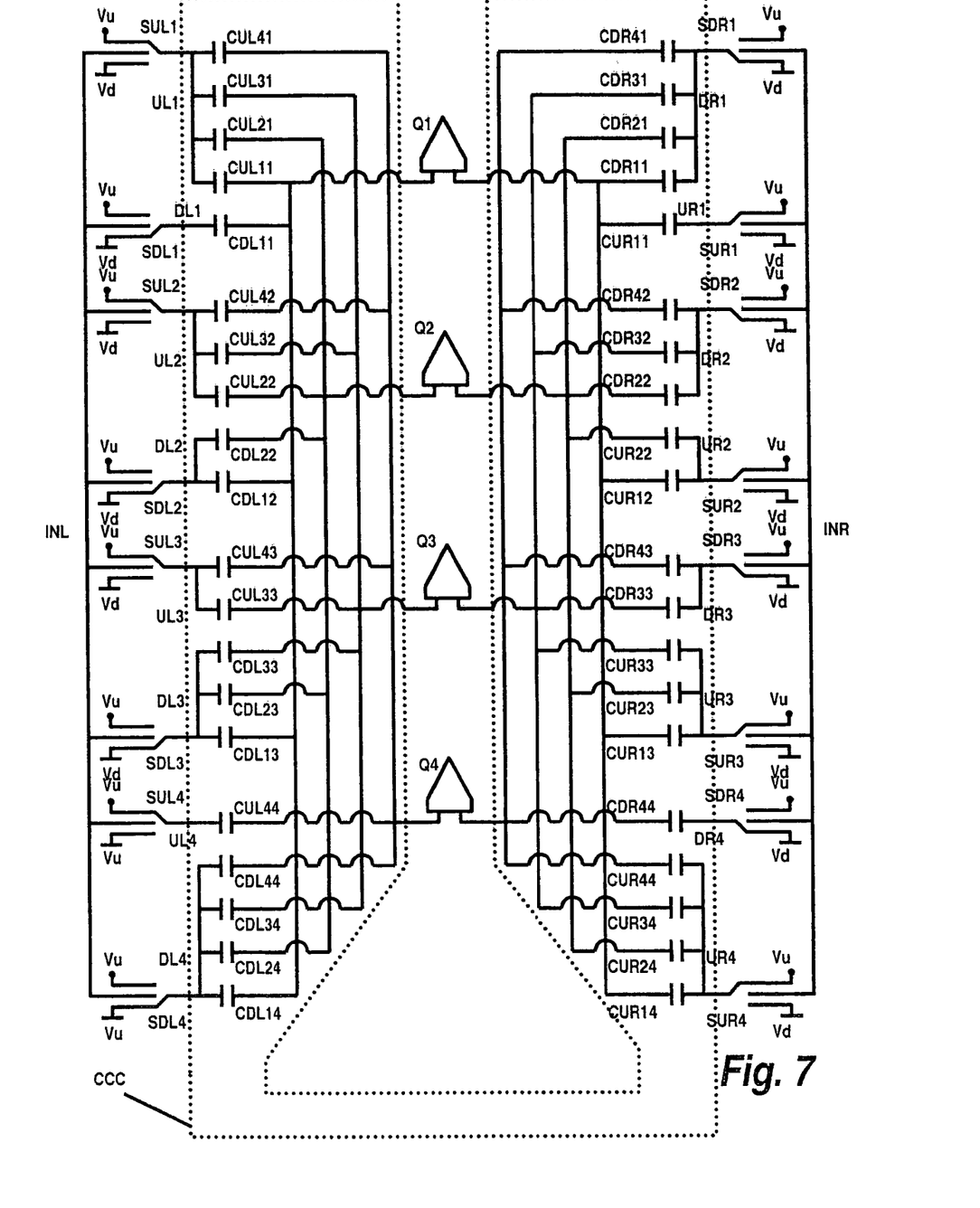
FIG. 7 shows a preferred embodiment of an analog-to-digital converter with a special capacitor arrangement and charge transfer circuit according to the invention.

FIG. 7 shows an embodiment of an analog-to-digital converter based on several blocks Q1 . . . Q4 according to the invention identical to the block Q shown in FIG. 6a and 6b, and furthermore based on the special capacitor arrangement CCC according to the invention. The operation of the embodiment is similar to the embodiment shown in FIG. 2, with the non-linear capacitor elements in the blocks Q1 . . . Q4 providing amplification without standing current to facilitate the comparison.

Figure 8A:
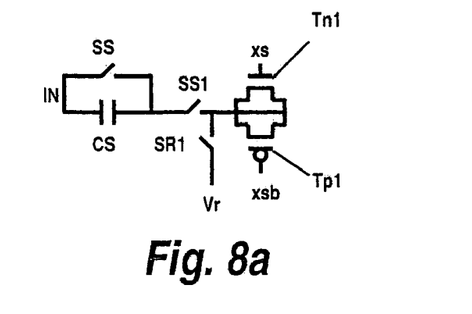
FIG. 8a shows a preferred embodiment of a sample and hold circuit according to the invention.

FIG. 8a shows an embodiment of a sample and hold circuit according to the present invention. The input signal IN is applied to the first terminal of a capacitor CS which can be reset using the switch SS. The other terminal of the capacitor CS can be connected to the non-linear capacitor formed by the PMOS and NMOS transistor Tp1 and Tn1 of which the gates are controlled by the control signals xsb and xs, respectively, and of which sources and drains are all connected together and form the charge receiving electrode. A switch SR1 allows to reset this charge receiving electrode to be reset to a reference voltage Vr.

Figure 8B:
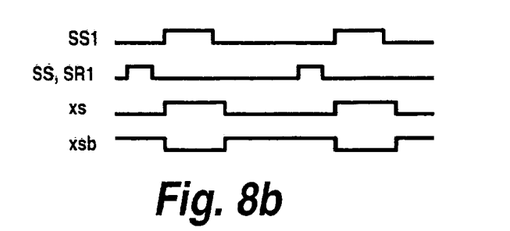
Figure 8C:
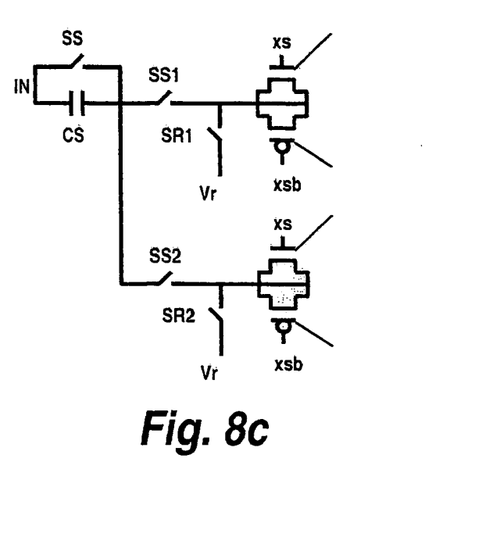
FIG. 8c shows another embodiment of a sample and hold circuit according to the invention.

The circuit operates as follows: in a first phase the capacitor CS is reset by means of the switch SS, and therefore both terminals of the capacitor CS are connected to the input, and the net charge on the capacitor CS is zero. At the same time the switch SR1 resets the node to which charge will be transferred, while the control signals xs and xsb control the transistors Tn1 and Tp1 to be off. The switch SS1 is open. At a certain moment the switches SS and RS1 are opened and the switch SS1 is closed, and the control signals xs and xsb are switched to turn the transistors on. The terminal of CS linked by means of the switch SS1 to the transistors will be pulled to the same voltage as the sources and drains of the transistors Tn1 and Tp1. FIG. 8b illustrates the control signals for the embodiment of a sample and hold circuit shown in FIG. 8a. FIG. 8c shows another embodiment of a sample and hold circuit according to the present invention where now a second non-linear capacitor element is added to the embodiment of FIG. 8a. This second non-linear capacitor element comprises an NMOS transistor Tn2 and a PMOS transistor Tp2, can be reset by means of a switch SR2 to reference voltage Vr, and can be connected to the capacitor CS by means of the switch SS2. Introducing more than one non-linear capacitor in this way allows to distribute sampled charge over several different electrodes for future use.

Figure 8D:
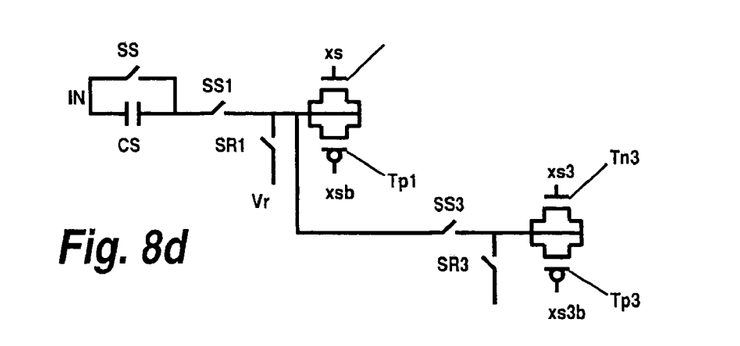
FIG. 8d shows an embodiment of a charge transfer pipeline according to the present invention.
Figure 8E:
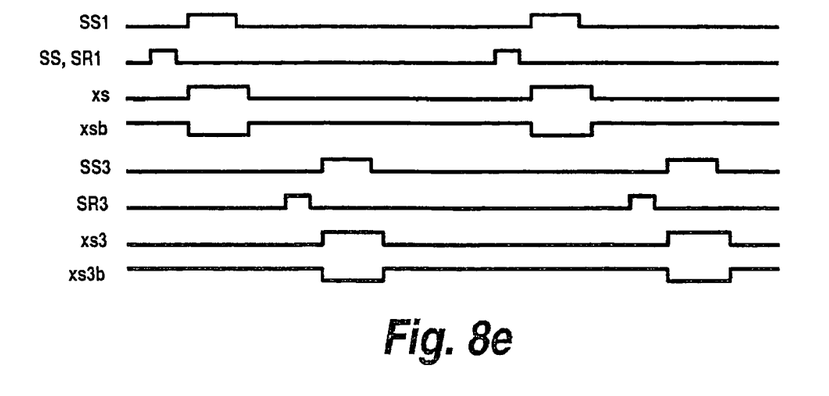
FIG. 8e shows the control signals of the embodiment in FIG. 8d.

FIG. 8d shows an embodiment of how a charge transfer pipeline can be created according to the present invention. The embodiment comprises the sample and hold circuit of FIG. 8a, where now another non-linear capacitance element is added. This second non-linear capacitor element comprises an NMOS transistor Tn3 and a PMOS transistor Tp3, can be reset using the switch SR3 to the reference voltage Vr, and can be connected to the first non-linear element by means of the switch SS3. The control signals are illustrated in FIG. 8e. The operation of the circuit is as follows: first the input signal IN is sampled onto the first non-linear element as explained previously. After the hold command is given by opening the switch SS1, and after the control signals xs and xsb are switched to lower the capacitance of the first non-linear element, the second non-linear capacitive element is reset by closing the switch SR3. After opening the switch SR3 again, switch SS3 is closed and the control signals xs3 and xs3b are switched to turn on the transistors Tn3 and Tp3. This increases the capacitance of the second non-linear element. If this capacitance is sufficiently large, the charge originally stored on the first non-linear capacitive element will redistribute and almost be fully transferred to the second non-linear capacitive element according to the present invention. More non-linear capacitive elements can be added to increase the number of stages in the charge transfer pipeline chain.

Similar to the embodiment shown in FIG. 8c charge can be transferred in a pipeline to two or more non-linear capacitive elements in parallel. Charge can also be transferred in a pipeline from more than one element in a previous stage to an element of the subsequent stage in the pipeline.

It has to be noted that charge transfer in a pipeline according to the present invention is based on charge redistribution governed by capacitance ratios. This is different from charge transfer in a pipeline of charge coupled devices (ccd), where charge is transferred between potential wells created by pulsing MOS capacitors into deep depletion mode using a multiphase clock.

Charge transfer according to the present invention depends on capacitance ratios and is therefore in practice never complete. It can therefore be useful to sample reference signals and transfer the sampled charge in an identical or very similar manner as the input signal or input signals to obtain properly scaled reference signals, in particular reference voltages.

Figure 9A:
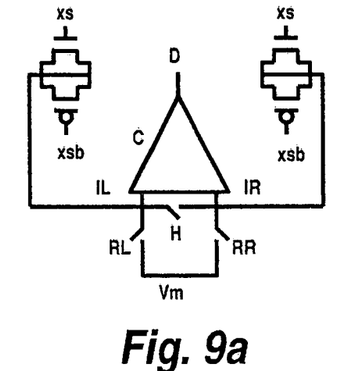
FIG. 9a shows a preferred embodiment of a building block of an analog-to-digital converter according to the invention.
Figure 9B:
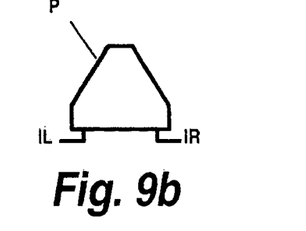

To combine the amplification according to the invention prior to comparison with the sample and hold circuit according to the invention and the special capacitor arrangement according to the invention, first consider the embodiment P according to the invention in FIG. 9a, which is identical to the embodiment Q of FIG. 7 of the invention, except that the switches SXL and SXR have been removed. FIG. 9b shows a schematic representation of this embodiment P.

Figure 10A:
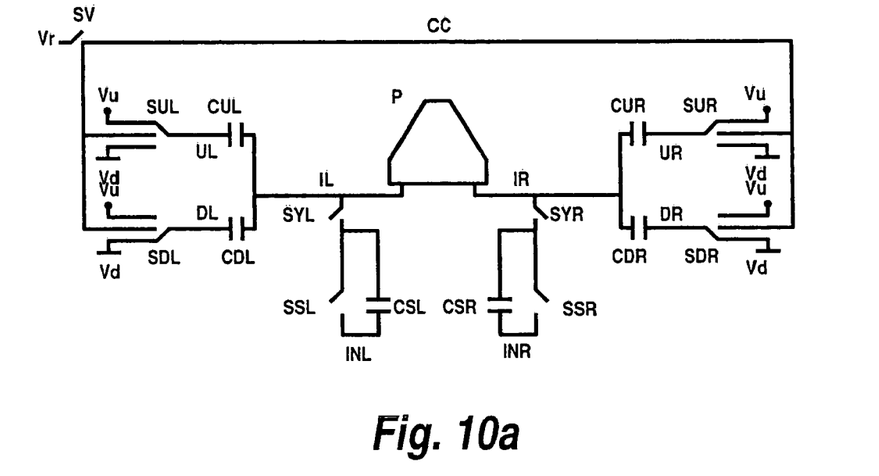
FIG. 10a shows a preferred embodiment of how the embodiment of FIG. 9a can be incorporated in a larger building block of analog-to-digital converter.
Figure 10B:
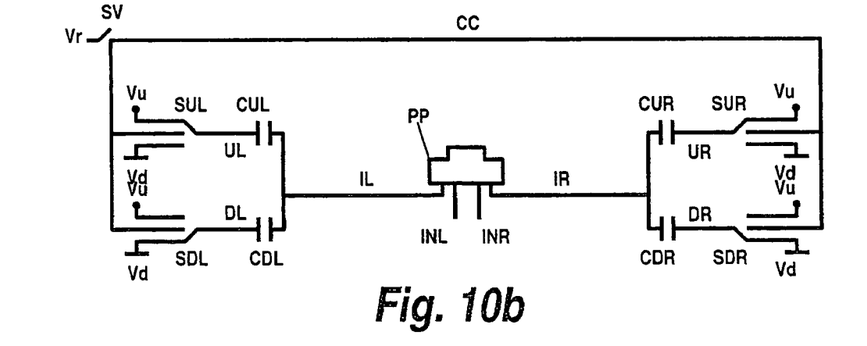

FIG. 10a shows an embodiment of how such an embodiment P of FIG. 9 can be used to construct a building block for an analog-to-digital converter similar to the building block of FIG. 1. The capacitors CUL, CUR, CDL and CDR can still be connected to the second and third reference voltages Vu and Vd in a similar way, but now the switches SUL, SDL, SUR and SDR can connect the capacitors CUL, CUR, CDL and CDR to an electrode CC which can be reset will not connect the terminals of said capacitors CUL, CUR, CDL and CDR to one of the inputs INL or INR, but to an electrode CC instead which can be reset to a reference voltage Vr by means of the switch SV. The other terminal of the capacitors CUL and CDL is connected to the input IL of the circuit P, and the other terminal of the capacitors CUR and CDR is connected to the input IR of the circuit P. The inputs INL and INR are connected to the first terminal of capacitors CSL and CSR, respectively, which can be reset by means of the switches SSL and SSR, respectively. Switches SYL and SYR can connect the second terminal of CSL and the second terminal of CSR to the inputs IL and IR of the circuit P. The circuit operates as follows: during a first phase switches SSL and SSR are closed to reset the capacitors CSL and CSR, respectively. At the same time switches SUL, SDL, SUR and SDR connect the capacitors CUL, CUR, CDL and CDR to the electrode CC which is reset to the reference voltage Vr. The inputs IL and IR of the circuit P are reset to the reference voltage Vm. After opening the switches SSL, SSR, RL, RR, and H (RL, RR and H comprised in P were resetting the inputs IL and IR), switches SYL and SYR are closed to link the capacitors CSL and CSR to the inputs IL and IR, respectively. At the same time the non-linear capacitors NL and NR are steered to maximum capacitance value and charge is transferred to the inputs IL and IR. Thereafter switches SYL and SYR are opened and the non-linear capacitance elements are steered to minimum value again. At that time also the capacitors CUL and CUR are connected to the second reference voltage Vu and the capacitors CDL and CDR are connected to the third reference voltage Vd to define the comparison level. The digital-to-analog conversion function of the circuit is similar to that of the circuit in FIG. 1. The embodiment of FIG. 10a is schematically represented in FIG. 10b where a circuit PP has four terminals IL, IR and the two inputs. The circuit PP comprises capacitors CSL, CSR, the switches SSL and SSR, the switches SYL and SYR, and the circuit P.

Figure 11:
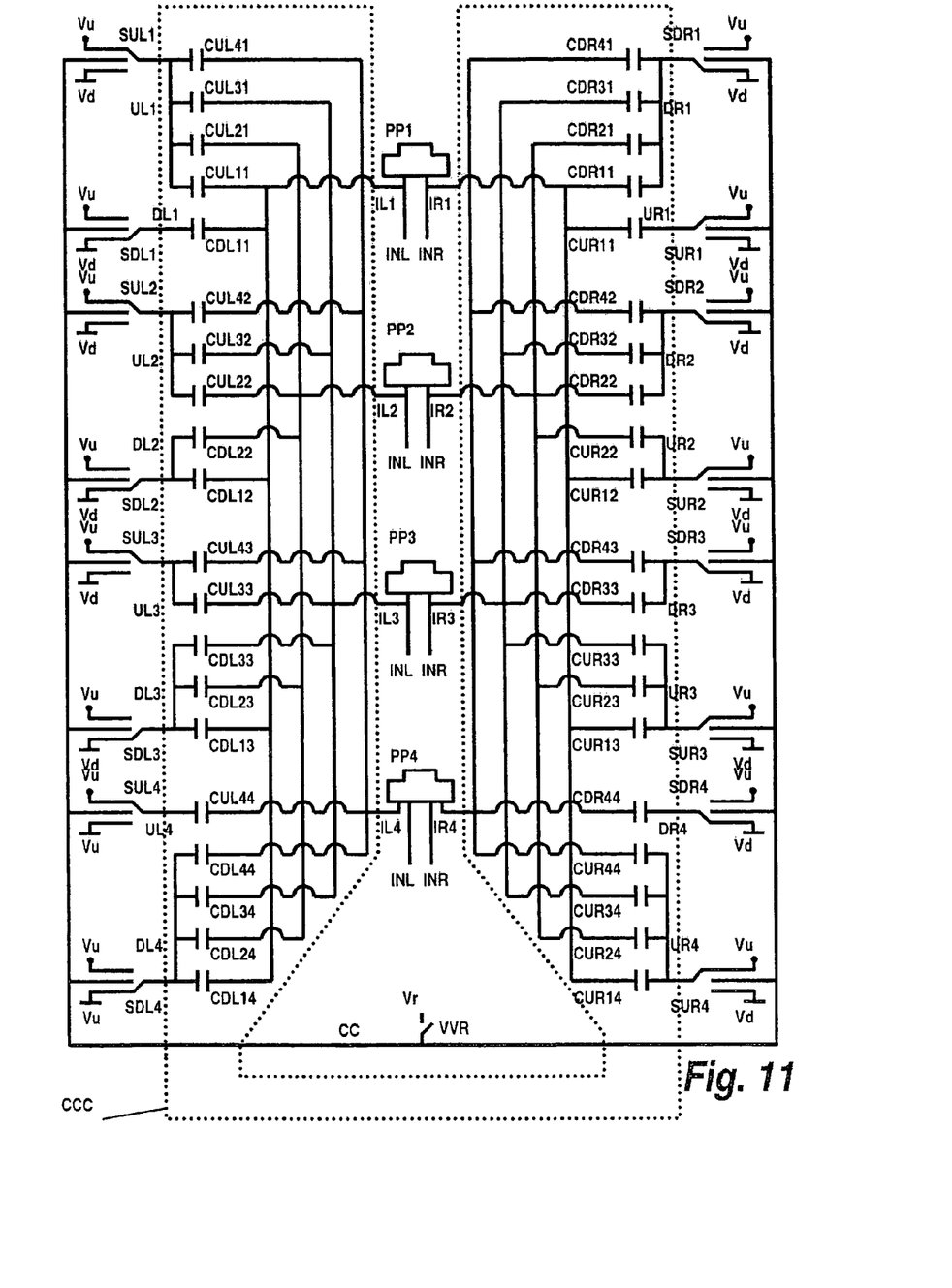
FIG. 11 shows how part of the embodiment shown in FIG. 10a and 10b can be used to construct an analog-to-digital converter according to the invention.

FIG. 11 shows an embodiment of how circuits PP1 ... PP4 identical to the circuit PP shown in FIG. 10 can be linked to the special capacitor arrangement CCC according to the invention. The blocks PP1 ... PP4 receive the inputs INL and INR on the corresponding inputs, and are connected to the capacitor arrangement CCC by means of their inputs IL and IR. The electrodes receiving INL and INR in FIG. 2 are here connected to an electrode CC which can be reset by means of a switch VVR to a reference potential Vr. The operation is similar to that of the circuit of FIG. 10a, with the difference that the special capacitor arrangement CCC provides the residue after comparison and application of the digital-to-analog conversion at the inputs of every block PP1 ... PP2. In conclusion, the present invention provides amplification without standing current, sampling of an input signal based on a non-linear capacitor of which the capacitance can be controlled by a control signal. The invention further provides multiple residue and level generation by means of a special capacitor arrangement. The invention therefore allows to construct analog-to-digital converters in which integrators and power consuming amplifiers with standing current can be eliminated which represent most of the power consumption in these converters. The multiple residue and level generation allows to carry out several conversion operations in parallel, and therefore improves the performance of the converter. Therefore this invention improves both power consumption and performance for these converters. The amplification without standing current can be generally applied and provides significant power savings for the same gain and operation speed compared to traditional amplifiers.

The present invention may be embodied in other specific forms without departing from its spirit or essential characteristics. The described embodiments are to be considered in all respects as illustrative and not restrictive.

The invention claimed is:

1. A circuit which transfers charge from a first capacitor to a second capacitor by charge redistribution, wherein
    the value of at least one of said capacitors is controlled by means of a control signal so as to enhance the transfer of charge in a first step and to control a voltage developed across at least one of said capacitors in a second step.

2. The circuit of claim 1, further comprising a first switch for connecting one terminal of said first capacitor to one terminal of said second capacitor.

3. The circuit of claim 1, further comprising a first switch for connecting one terminal of said first capacitor to one terminal of said second capacitor, a second switch for resetting said second capacitor, and means for opening said first switch after said transfer of charge and before application of said control signal.

4. The circuit of claim 1, said capacitor being made of at least one MOS-transistor, said control signal being applied to the gate of said MOS transistor.

5. The circuit of claim 4, at least one of said capacitors comprising an NMOS and a PMOS transistor of which the sources and drains are all connected together.

6. The circuit of claim 5, used as an amplification means.

7. The circuit of claim 5, used as a sample and hold means.

8. The circuit of claim 1, wherein redistribution of charges between said capacitors is applied to input signals as well as to reference signals used in said circuit.

9. The circuit of claim 1, wherein charges are transferred from a first element to more than one other element.

10. The circuit of claim 1, where charges are transferred from more than one element to another element.

11. The circuit of claim 1, further comprising:
    at least two comparison circuits;
    a capacitor arrangement comprising at least two comparison circuits,
    at least one switch controlled by an output of at least one of said comparison circuits;
    a plurality of additional capacitors, each of said additional capacitors having one terminal connected to one of said switches; wherein
    the inputs of at least two different comparison circuits are affected by two different of said additional capacitors, or sets of said additional capacitors, connected to switches controlled by at least one common at least one of said comparison circuits.

12. A charge transfer pipeline comprising a plurality of circuits according to claim 1.

13. A circuit which transfers charge from a first capacitor to a second capacitor, at least one capacitor being made of at least one MOS-transistor, said circuit comprising: a first switch for connecting one terminal of said first capacitor to one terminal of said second capacitor, a second switch for resetting said second capacitor, means for applying a control signal for controlling the value of at least one of said capacitors means for opening said first switch after a transfer of charge and before application of said control signal.

14. An open loop amplifier comprising a charge redistribution circuit which transfers charge from a first capacitor to a second capacitor, wherein the value of at least one of said capacitors is controlled by means of a control signal, so as to enhance the transfer.

15. An open loop sample and hold circuit comprising a charge redistribution circuit which transfers charge from a first capacitor to a second capacitor, wherein the value of at least one of said capacitors is controlled by means of a control signal, so as to enhance the transfer.

16. A method for transferring charges from a first capacitor to a second capacitor, comprising the steps of:
    connecting a first terminal of said first capacitor to a first terminal of said second capacitor by means of a first switch,
    varying the value of said second capacitor when said first switch is closed, and
    opening said first switch, varying the value of said second capacitor by means of a control signal.

17. The method of claim 16, further comprising an initial step during which said second capacitor is reset.

18. A capacitor arrangement comprising:
    at least two comparison circuits; and
    a plurality of capacitors, each capacitor having one terminal connected to at least one of one or more switches each controlled by at least one comparison circuit, wherein
    the inputs of at least two different comparison circuits are affected by different capacitors connected to said one or more switches controlled by a common at least one of said comparison circuits.

19. The capacitor arrangement of claim 18, where the inputs of all comparison circuits are affected by different capacitors connected to switches controlled by said at least one common comparison circuit.

20. The capacitor arrangement of claim 19 where the inputs of all comparison circuits are affected by the outputs of all comparison circuits and by different capacitors.

21. The capacitor arrangement of claim 20, further comprising means to provide a predefined offset at the inputs of at least two comparators.

22. An analog-to-digital converter part comprising a capacitor arrangement with:
    at least two comparison circuits; and
    a plurality of capacitors, each of said capacitors having one terminal connected to at least one of one or more switches each controlled by at least one of said comparison circuits, wherein
    the inputs of at least two different ones of said comparison circuits are affected by two different sets of said capacitors connected to said one or more switches that are controlled by at least a common one of said comparison circuits.

23. A transfer charge circuit comprising:
    a first capacitor;
    a second capacitor;
    one or more switches for connecting said first capacitor to said second capacitor when the switches are closed so as to redistribute charges between said first capacitor and said second capacitor, wherein the value of at least one of said capacitors is controlled by means of a control signal.

24. A circuit for transferring charges between a first capacitor and a second capacitor, wherein the first capacitor is discharged and the second capacitor is charged during said transfer, and wherein the value of at least one of said capacitors is controlled by means of a control signal.

25. An open loop circuit which transfers a charge from a first capacitor to a second capacitor by charge redistribution, wherein the value of at least one of said capacitors is controlled by means of a control signal so as to enhance the transfer of charge between said capacitors.

26. A method for transferring a charge from a first capacitor to a second capacitor, comprising the steps of:

connecting a first terminal of said first capacitor to a first terminal of said second capacitor through a switch;

closing said switch so as to transfer said charge from said first capacitor to said second capacitor; and opening said switch and reducing a value of said second capacitor so as to increase the voltage across said second capacitor.

* * * * *